United States Patent
Wu et al.

(10) Patent No.: US 10,615,533 B2
(45) Date of Patent: Apr. 7, 2020

(54) ELECTRICAL CONNECTOR

(71) Applicant: LOTES CO., LTD, Keelung (TW)

(72) Inventors: Yong Quan Wu, Keelung (TW); Tung Ming Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/299,492

(22) Filed: Mar. 12, 2019

(65) Prior Publication Data

US 2019/0280417 A1  Sep. 12, 2019

(30) Foreign Application Priority Data

Mar. 12, 2018 (CN) .......................... 2018 1 0199198

(51) Int. Cl.

| | |
|---|---|
| *H01R 12/00* | (2006.01) |
| *H01R 13/422* | (2006.01) |
| *H01R 4/02* | (2006.01) |
| *H01R 12/57* | (2011.01) |
| *H01R 12/71* | (2011.01) |
| *H01R 13/24* | (2006.01) |
| *H01R 13/405* | (2006.01) |
| *H01R 13/6588* | (2011.01) |
| *H01R 13/6597* | (2011.01) |
| *H05K 3/34* | (2006.01) |

(52) U.S. Cl.
CPC ......... *H01R 13/4223* (2013.01); *H01R 4/024* (2013.01); *H01R 12/57* (2013.01); *H01R 12/716* (2013.01); *H01R 13/24* (2013.01); *H01R 13/405* (2013.01); *H01R 13/6588* (2013.01); *H01R 13/6597* (2013.01); *H05K 3/341* (2013.01); *H05K 2201/10954* (2013.01)

(58) Field of Classification Search
CPC .............. H01R 13/4223; H01R 13/405; H01R 13/6588; H01R 12/716; H01R 12/57; H01R 4/024; H05K 3/341; H05K 2201/10954
USPC ..................................... 439/66, 83, 586, 862
See application file for complete search history.

(56) References Cited

U.S. PATENT DOCUMENTS

| | | | |
|---|---|---|---|
| 10,381,755 B2* | 8/2019 | Chang ................. | H01R 12/716 |
| 10,405,448 B2* | 9/2019 | Rengarajan .......... | H05K 7/1053 |
| 2004/0259433 A1* | 12/2004 | Chiang .............. | H01R 13/2435 |
| | | | 439/862 |

(Continued)

FOREIGN PATENT DOCUMENTS

| | | |
|---|---|---|
| CN | 201674034 U | 12/2010 |
| CN | 107257059 A | 10/2017 |

*Primary Examiner* — Khiem M Nguyen
(74) *Attorney, Agent, or Firm* — Locke Lord LLP; Tim Tingkang Xia, Esq.

(57) ABSTRACT

An electrical connector for electrically connecting a chip module to a circuit board includes a body, having a plurality of accommodating slots penetrating the body, where a slot wall of at least one of the accommodating slots protrudes inward to form a boss, and the boss has a stopping corner; and a plurality of conductive terminals, correspondingly accommodated in the accommodating slots. At least one of the conductive terminals has an inclined portion, formed by tapering one side of the conductive terminal, wherein the inclined portion is adjacent to the stopping corner, the inclined portion is not parallel to a top surface of the boss, and the inclined portion is at least partially located above the stopping corner and configured to limit the conductive terminal from moving downward.

14 Claims, 9 Drawing Sheets

(56) References Cited

U.S. PATENT DOCUMENTS

| 2008/0171478 A1* | 7/2008 | Tsai | H01R 12/57 |
| | | | 439/862 |
| 2010/0184334 A1* | 7/2010 | Ma | H01R 13/2442 |
| | | | 439/626 |
| 2011/0053426 A1* | 3/2011 | Cheng | H01R 12/57 |
| | | | 439/660 |

* cited by examiner

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN 201810199198.9 filed in China on Mar. 12, 2018. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector capable of avoiding tearing of solder.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An electrical connector as disclosed in the Chinese Patent Application No. CN201710454474.7 includes an insulating body having multiple accommodating slots, and multiple conductive terminals accommodated in the accommodating slots. Each conductive terminal includes a base, an elastic arm and a strip connecting portion extending upward from the base, and a soldering portion and a fastening portion extending downward from the base. On a side edge of the conductive terminal, a recess is provided between the strip connecting portion and the fastening portion. An upper portion of the recess is an inward inclined portion. The insulating body protrudes inward to each accommodating slot to form a boss opposite to the recess, and the upper portion of the boss has a slope surface opposite and parallel to the inclined portion of the recess of the conductive terminal.

The soldering portion of each conductive terminal is connected to a circuit board by soldering the solder. When the insulating body is deformed by heat or a force to cause the boss to contact the conductive terminal, the slope surface of the boss is parallel to the inclined portion of the recess of the conductive terminal, and the slope surface of the boss matches with the inclined portion of the recess of the conductive terminal, such that a relatively large stress range exists between the boss and the recess of the conductive terminal, the stress generated by the deformation of the insulating body is completely transferred to the conductive terminal, and the conductive terminal receives a relatively large pull force, which easily leads to tearing of the solder.

Therefore, a heretofore unaddressed need to design a new electrical connector exists in the art to address the aforementioned deficiencies and inadequacies.

SUMMARY

The present invention is directed to an electrical connector capable of avoiding tearing of solder after body deformation.

To achieve the foregoing objective, the invention adopts the following technical solutions.

An electrical connector includes: a body, having a plurality of accommodating slots vertically penetrating the body, wherein each of the accommodating slots has a first surface, a second surface deviated toward the accommodating slot relative to the first surface, and a connecting surface connecting the first surface with the second surface, and a connecting location of the connecting surface and the second surface forms a stopping corner; and a plurality of conductive terminals, correspondingly accommodated in the accommodating slots, wherein each of the conductive terminals has: an inclined portion, formed by tapering downward from a top of one side of the conductive terminal, wherein the inclined portion is at least partially located above the stopping corner, and the inclined portion is not parallel to the connecting surface; and a soldering portion, located below a bottom surface of the body, and limited by the bottom surface of the body to limit the conductive terminal from moving upward.

In certain embodiments, an acute included angle between the inclined portion and the first surface is less than 45 degrees.

In certain embodiments, an acute included angle between the connecting surface and the first surface is greater than an acute included angle between the inclined portion and the first surface.

In certain embodiments, a height of the stopping corner is between an upper end and a lower end of the inclined portion.

In certain embodiments, the first surface and the second surface are parallel to each other.

In certain embodiments, the connecting surface is formed by extending downward obliquely from the first surface, an upper end of the inclined portion is higher than an upper end of the connecting surface, and a length of the inclined portion is greater than a length of the connecting surface.

In certain embodiments, each of the conductive terminals has a protrusion, and the protrusion is located above the inclined portion and interferes with the first surface.

In certain embodiments, the soldering portion comprises two clamping arms configured to clamp a solder, and the two clamping arms extends beyond a horizontal projection of a corresponding one of the accommodating slots after the two clamping arms clamp the solder.

Compared with the related art, certain embodiments of the present invention have the following beneficial effects:

Because the inclined portion is at least partially located above the stopping corner, the stopping corner engages with the inclined portion to limit the conductive terminal from moving downward, and the soldering portion limits the conductive terminal from moving upward after the solder is clamped. When the body is deformed by heat or a force to cause the stopping corner to be in contact with the inclined portion, the stopping corner can move upward or downward along the inclined portion. Meanwhile, the stopping corner is worn to offset stress transferred from the body to the conductive terminal, thereby avoiding tearing of the solder.

An electrical connector includes: a body, having a plurality of accommodating slots penetrating the body, wherein a slot wall of at least one of the accommodating slots protrudes inward to form a boss, and the boss has a stopping corner; and a plurality of conductive terminals, correspondingly accommodated in the accommodating slots, wherein at least one of the conductive terminals has: an inclined portion, formed by tapering one side of the conductive terminal, wherein the inclined portion is adjacent to the stopping corner, the inclined portion is not parallel to a top surface of the boss, and the inclined portion is at least partially located above the stopping corner and configured to limit the conductive terminal from moving downward.

In certain embodiments, an acute included angle between the inclined portion and the slot wall of a corresponding one of the accommodating slots is less than 45 degrees.

In certain embodiments, a height of the stopping corner is between an upper end and a lower end of the inclined portion.

In certain embodiments, the electrical connector is configured to connect a chip module to a circuit board; each of the conductive terminals has a main portion bending laterally, and the main portion comprises a first base and a second base; the first base bends and extends upward to form an elastic arm, the elastic arm has a through slot, and an extending tail end of the elastic arm has a contact portion being arc-shaped and configured to be in contact with the chip module; the first base extends downward to form a soldering portion configured to be connected to the circuit board; and the second base extends upward to form a strip connecting portion.

In certain embodiments, the soldering portion comprises two clamping arms configured to clamp a solder, and the two clamping arms extends beyond a horizontal projection of a corresponding one of the accommodating slots after the two clamping arms clamp the solder.

In certain embodiments, a top surface of the body protrudes upward to form a plurality of supporting blocks configured to support the chip module, each of the supporting blocks has a notch, and a horizontal projection of the notch is located within a horizontal projection of a corresponding one of the accommodating slots.

In certain embodiments, the stopping corner is closer to a bottom surface of the body relatively than to a top surface of the body.

In certain embodiments, the inclined portion is completely accommodated in a corresponding one of the accommodating slots.

Compared with the related art, certain embodiments of the present invention have the following beneficial effects:

The stopping corner of the boss is adjacent to the inclined portion, and the inclined portion is at least partially located above the stopping corner and configured to limit the conductive terminal from moving downward. When the body is deformed by heat or a force to cause the stopping corner in the accommodating slot to contact the inclined portion of the conductive terminal, the contact area between the stopping corner and the inclined portion is small, such that the stress is concentrated; and the stopping corner has smaller hardness than the inclined portion, such that the stopping corner can be easily crashed and worn to offset stress transferred from the body to the conductive terminal, thereby avoiding tearing of the solder. The stopping corner can move upward or downward along the inclined portion, thereby further dispersing the stress.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
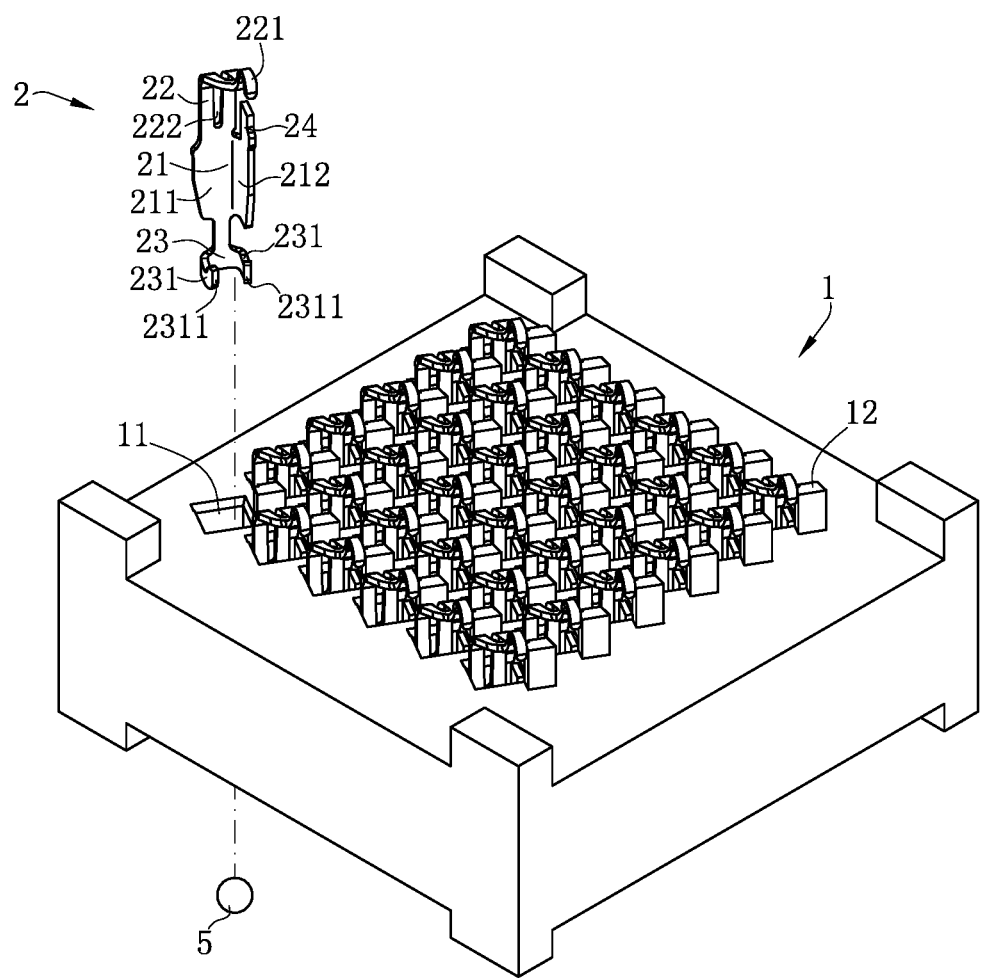
FIG. 1 is a perspective view of an electrical connector according to certain embodiments of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-9. In accordance with the purposes of this invention, as embodied and broadly described herein, this invention, in one aspect, relates to an electrical connector.

Referring to FIG. 1 to FIG. 9, a preferred embodiment of the electrical connector 100 according to the present invention is shown. The electrical connector 100 includes a body 1 and a plurality of conductive terminals 2 installed in the body 1, and the electrical connector 100 is configured to connect a chip module 3 to a circuit board 4.

Figure 2:
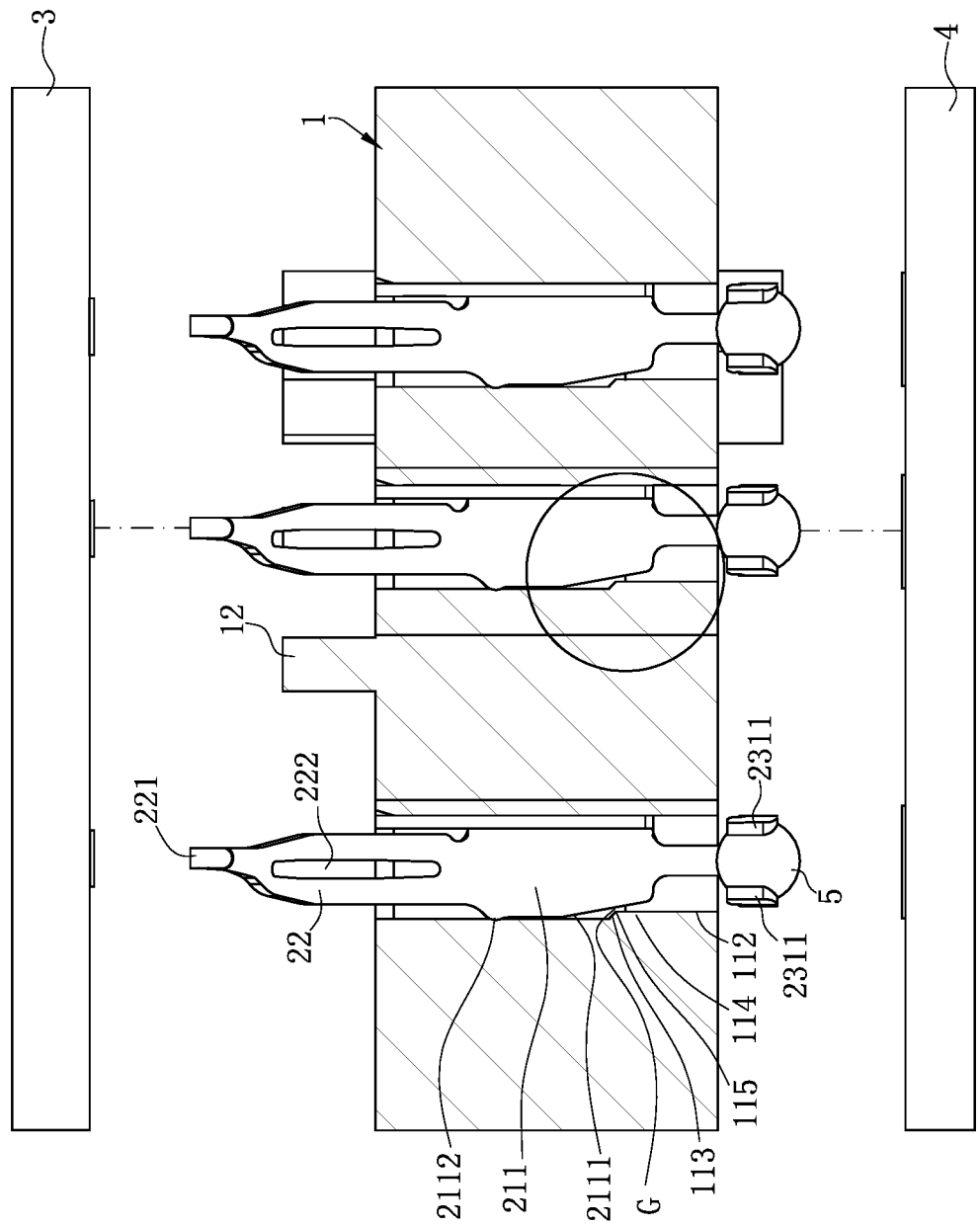
FIG. 2 is a sectional view of an electrical connector according to certain embodiments of the present invention.
Figure 3:
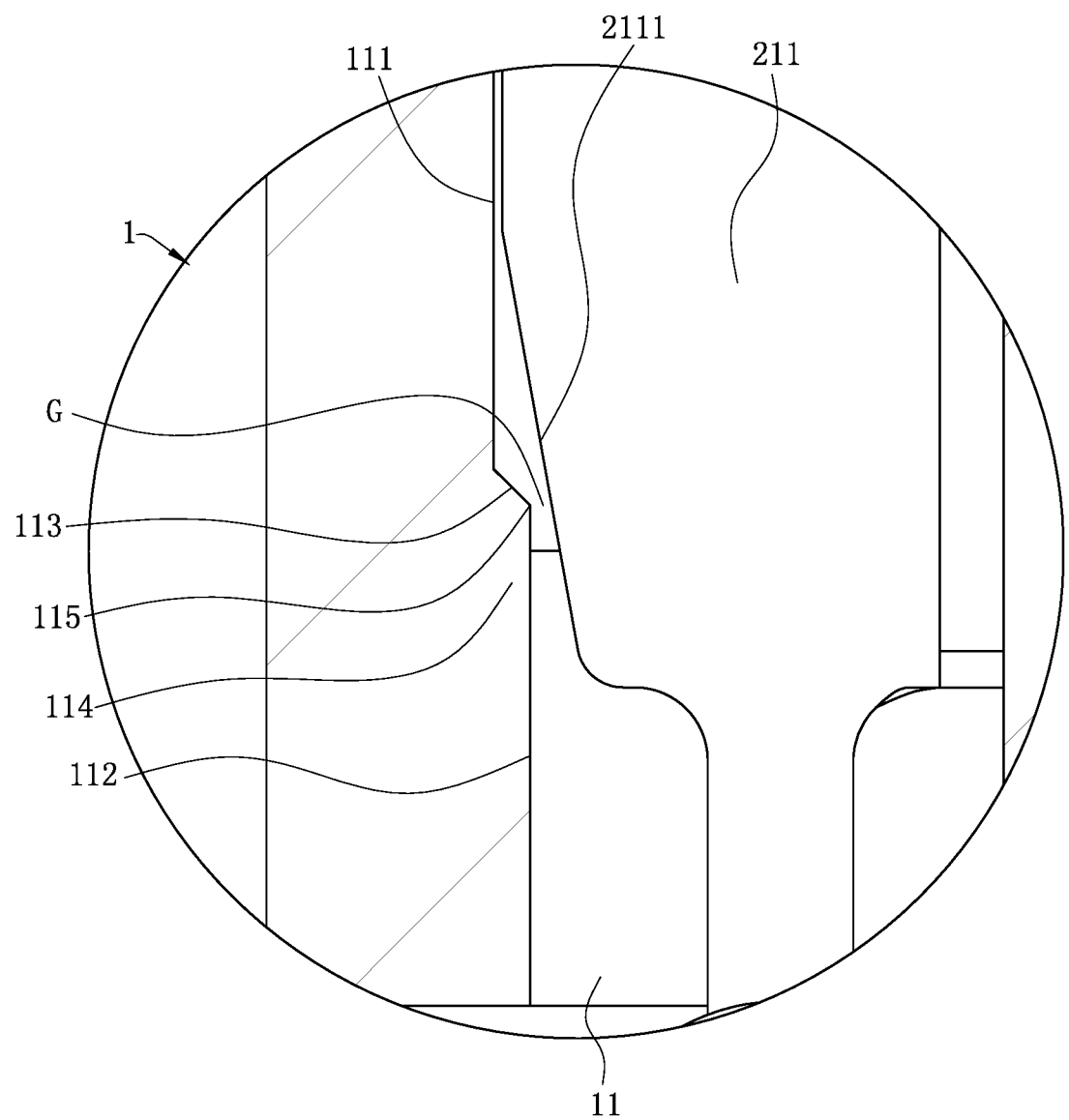
FIG. 3 is a partial enlarged view of FIG. 2.

Referring to FIG. 1, the body 1 is made of an insulating material, and provided with a plurality of accommodating slots 11. The accommodating slots 11 are arranged in a matrix and vertically penetrate the body 1, and are configured to accommodate the conductive terminals 2. Referring to FIG. 2 and FIG. 3, each accommodating slot 11 has a first surface 111, which is vertically disposed; a second surface 112, which is parallel to the first surface 111, and is deviated toward the accommodating slot 11 relative to the first surface 111; and a connecting surface 113, which connects the first surface 111 to the second surface 112. The first surface 111 is equivalent to a slot wall of the accommodating slot 11. The connecting surface 113 and the second surface 112 are equivalent to a boss 114 formed by the slot wall protruding inward so a top surface of the boss 114 is the connecting surface 113. An connecting location of the connecting surface 113 and the second surface 112 forms a stopping corner 115. The stopping corner 115 is located on the boss 114 and is closer to the bottom surface of the body 1 relatively than to the top surface of the body 1, and is configured to limit the conductive terminal 2 from moving downward. In this embodiment, an included angle between the connecting surface 113 and the second surface 112 is an obtuse angle. In other embodiments, the included angle may also be a right angle or acute angle, or the stopping corner 115 may be arc-shaped.

Figure 4:
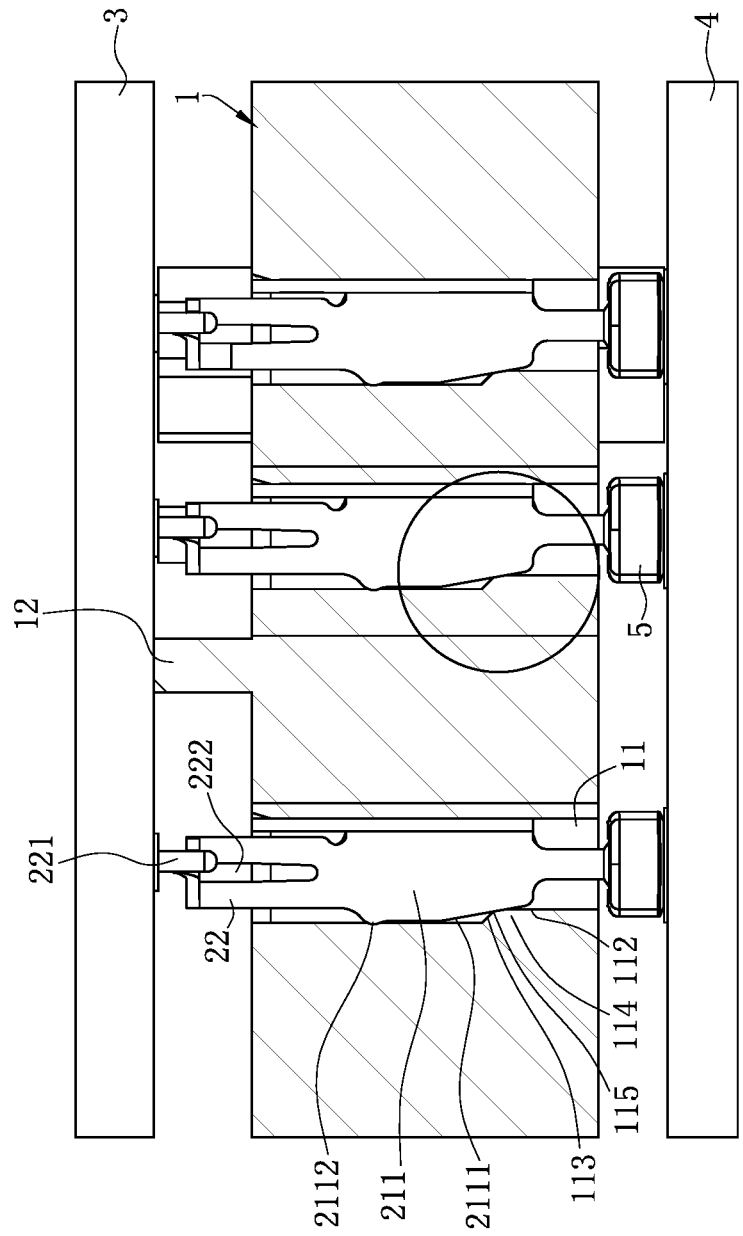
FIG. 4 is a sectional view of the electrical connector according to certain embodiments of the present invention, where a stopping corner in one of the accommodating slots is in contact with an inclined portion of a conductive terminal.
Figure 6:
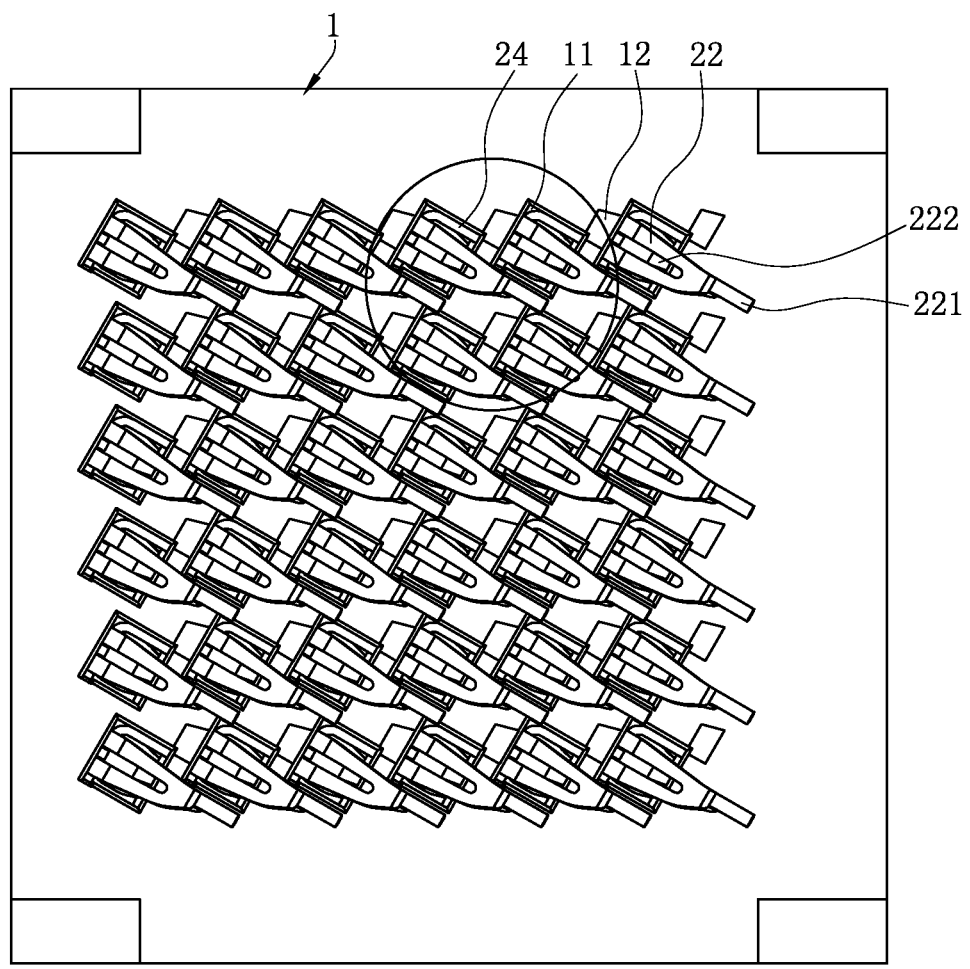
FIG. 6 is a top view of FIG. 1.
Figure 7:
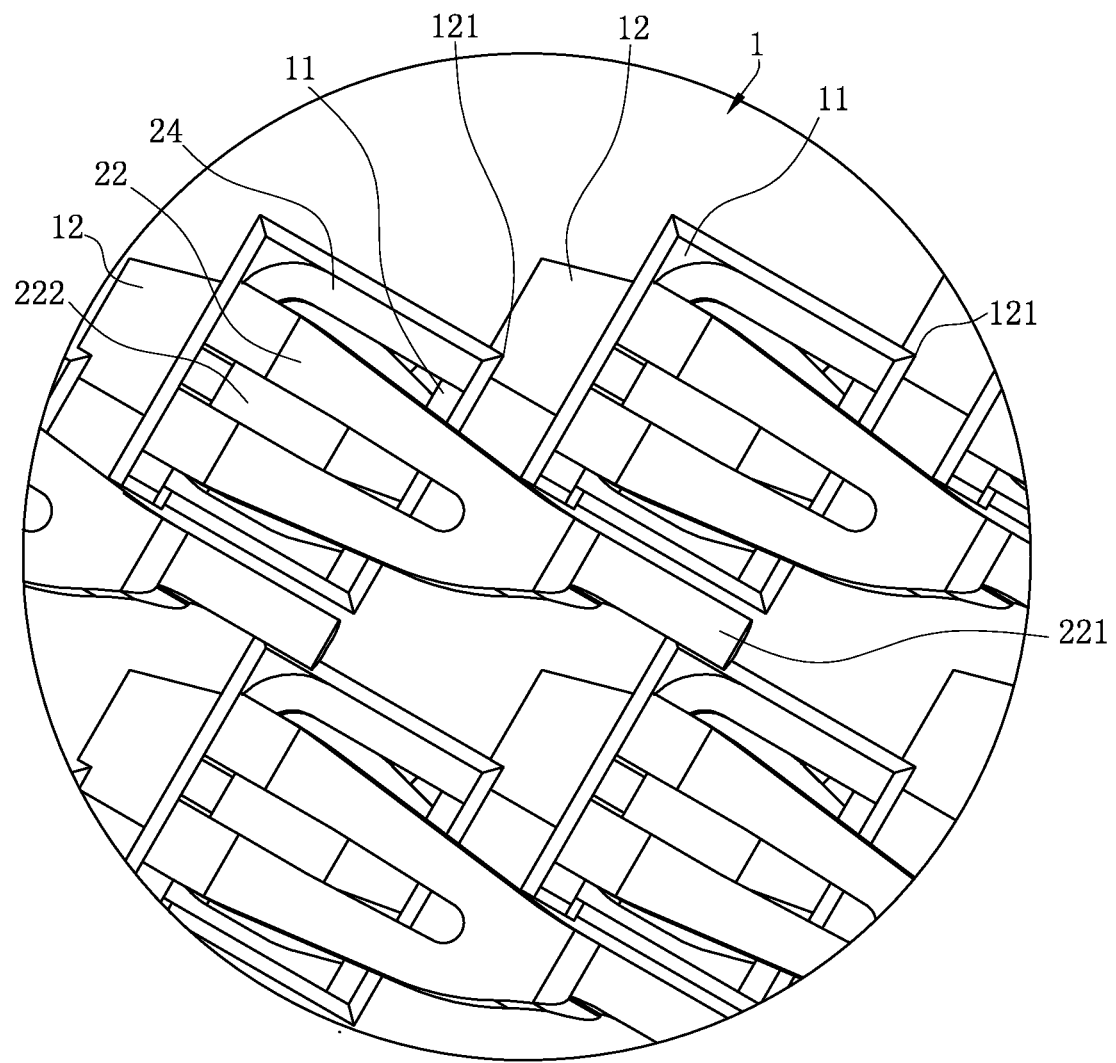
FIG. 7 is a partial enlarged view of FIG. 6.

Referring to FIG. 4, a top surface of the body 1 protrudes upward to form a plurality of supporting blocks 12 for supporting the chip module 3. Referring to FIG. 6 and FIG. 7, each of the supporting blocks 12 has a right-angled notch 121, and a horizontal projection of the notch 121 is located within a horizontal projection of the corresponding accommodating slot 11. In this way, the area occupied by the support blocks 12 can be compressed, such that the conductive terminals 2 are arranged in the body 1 in a compact manner while an effective support is provided for the chip module 3, which facilitates miniaturization of the electrical connector 100 and accommodates more conductive terminals 2.

Referring to FIG. 1 and FIG. 2, each conductive terminal 2 is formed by punching a metal sheet, and includes a main portion 21. The main portion 21 includes a first base 211 and a second base 212. The first base 211 bends and extends upward to form an elastic arm 22, and an extending tail end of the elastic arm 22 has a contact portion 221 which is arc-shaped and configured to be in contact with the chip module 3. The elastic arm 22 further has a through slot 222, such that two conductive channels are formed between the contact portion 221 and the first base 211. Referring to FIG. 7, the contact portion 221 is deviated from a center line of the elastic arm 22.

Figure 8:
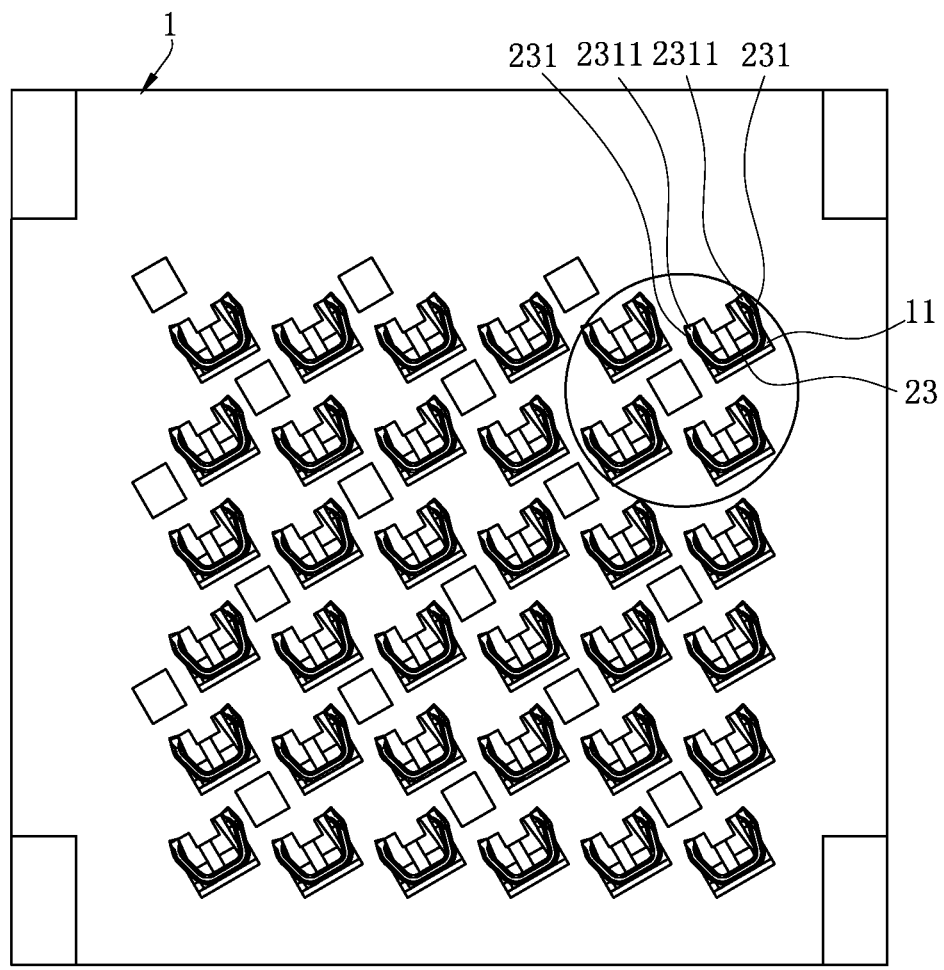
FIG. 8 is a bottom view of the FIG. 1.
Figure 9:
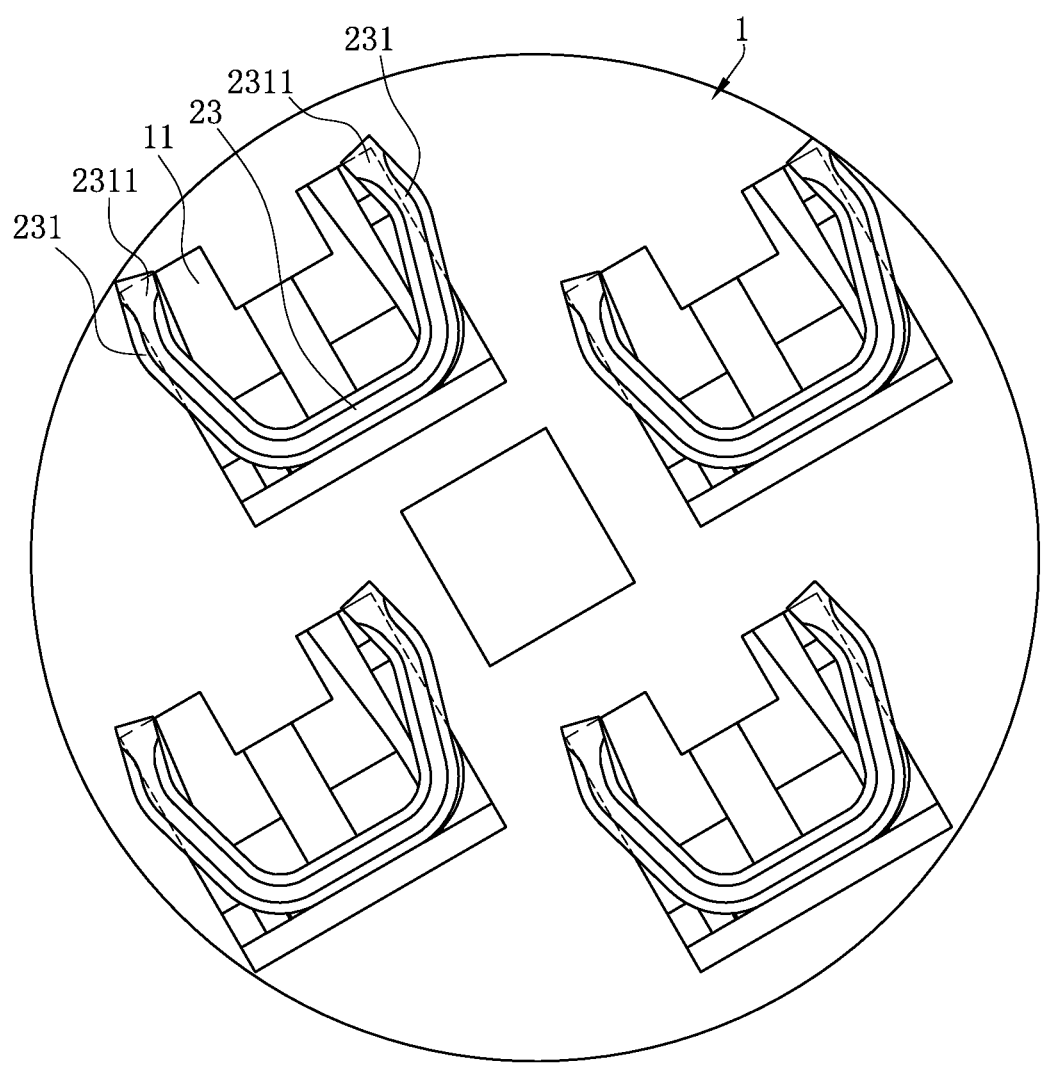
FIG. 9 is a partial enlarged view of FIG. 8.

Referring to FIG. 1 and FIG. 2, the first base 211 extends downward to form a soldering portion 23 which extends beyond the accommodating slot 11, so as to be soldered to the circuit board 4 by a solder 5. The soldering portion 23 includes two clamping arms 231 for clamping the solder 5, and each of the clamping arms 231 is provided with a hook portion 2311 located at a tail end of the clamping arm 231. The hook portion 2311 extends upward, so as to increase the contact area between the clamping arms 231 and the solder 5. Referring to FIG. 8 and FIG. 9, after the two clamping arms 231 clamp the solder 5, the solder 5 expands the two clamping arms 231, such that the two clamping arms 231 and the hook portions 2311 extends beyond the horizontal projection of the corresponding accommodating slot 11, and are thus limited by a bottom surface of the body 1 in a vertical direction, thereby limiting the conductive terminal 2 from moving upward.

Referring to FIG. 2 and FIG. 3, a lower half portion of one side of the first base 211 has an inclined portion 2111, which is formed by tapering the first base 211 downward from a top thereof, and does not extend beyond the bottom surface of the body 1 and is completely accommodated in the accommodating slot 11. An acute included angle between the inclined portion 2111 and the first surface 111 is less than 45 degrees, and is smaller than an acute included angle between the connecting surface 113 and the first surface 111. A length of the inclined portion 2111 is greater than a length of the connecting surface 113. One part of the inclined portion 2111 is located above the stopping corner 115, and the other part extends to be below the stopping corner 115. In this embodiment, after the conductive terminal 2 is assembled into the body 1, a gap G exists between the inclined portion 2111 and the stopping corner 115. When the electrical connector 100 is heated, for example, by being soldered to the circuit board 4 through a brazier, or is subject to a force to cause expansion or other deformation of the body 1, the gap G acts as a reserved space between the stopping corner 115 and the inclined portion 2111, so as to prevent the stopping corner 115 from directly contacting the conductive terminal 2 to certain extents.

Figure 5:
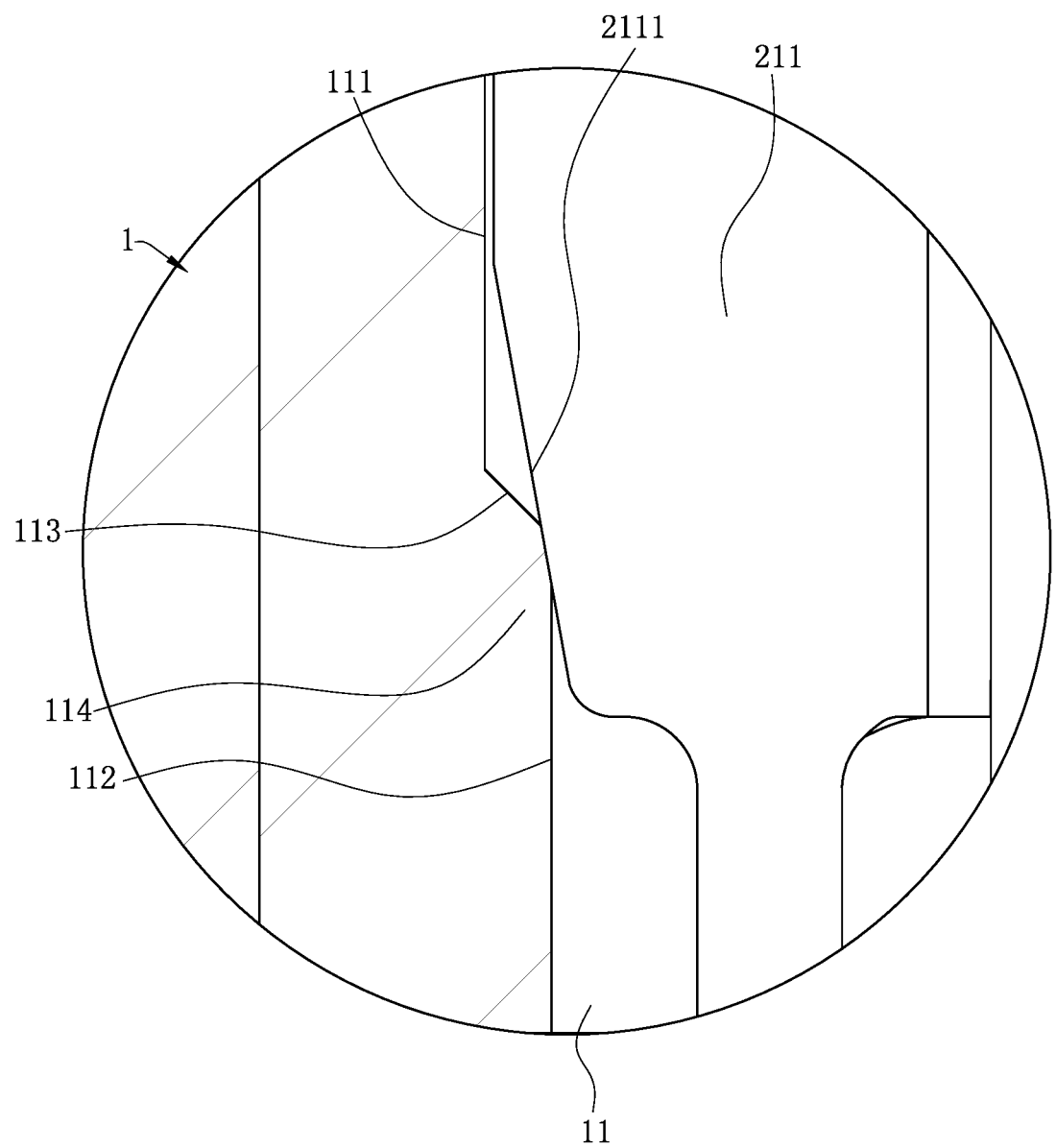
FIG. 5 is a partial enlarged view of FIG. 4.

Referring to FIG. 4 and FIG. 5, if the deformation of the body 1 is relatively large, causing the displacement of the stopping corner 115 to be greater than the gap G, the stopping corner 115 contacts the inclined portion 2111 and can slide along the inclined portion 2111. Since the stopping corner 115 has smaller hardness than the inclined portion 2111 and rubs against the inclined portion 2111, the stopping corner 115 is crashed and worn to offset the stress transferred from the body 1 to the conductive terminal 2. Therefore, the pull force received by the conductive terminal 2 is decreased, thereby avoiding tearing of the solder 5, and ensuring a favorable electrical connection between the electrical connector 100 and the circuit board 4. Since the length of the inclined portion 2111 is greater than the length of the connecting surface 113, and the inclined portion 2111 is distributed on the upper and lower sides of the stopping corner 115, the stopping corner 115 has enough wear strokes both on the top and bottom to offset the deformational stress generated by the body 1 in different directions, thereby further avoiding tearing of the solder 5.

Referring to FIG. 1, the second base 212 extends upward to form a strip connecting portion 24. Referring to FIG. 2, the first base 211 further has a protrusion 2112, and the protrusion 2112 interferes with the first surface 111 above of the inclined portion 2111 so as to fix the conductive terminal 2.

To sum up, the electrical connector 100 according to certain embodiments of the present invention has the following beneficial effects:

(1) A slot wall of each accommodating slot 11 protrudes inward to form the boss 114, and the boss 114 has the stopping corner 115 configured to limit the conductive terminal 2 from moving downward.

(2) The gap G exists between the stopping corner 115 and the inclined portion 2111. When the body 1 is deformed by heat or a force, the gap G acts as the reserved space between the body 1 and the conductive terminal 2, thereby avoiding direct contact between the body 1 and the conductive terminal 2 to certain extents.

(3) When the body 1 is deformed by heat or a force, causing the displacement of the stopping corner 115 to exceed the gap G and the stopping corner 115 to contact the inclined portion 2111, the stopping corner 115 can slide upward or downward along the inclined portion 2111. Since the stopping corner 115 has smaller hardness than the inclined portion 2111 and rubs against the inclined portion 2111, the stopping corner 115 is crashed and worn to offset the stress transferred from the body 1 to the conductive terminal 2. Therefore, the pull force received by the conductive terminal 2 is decreased, thereby avoiding tearing of the solder 5, and ensuring a favorable electrical connection between the electrical connector 100 and the circuit board 4.

(4) The length of the inclined portion 2111 is greater than the length of the connecting surface 113 and the inclined portion 2111 penetrates through the plane on which the connecting surface 113 is located, causing the inclined portion 2111 to be distributed on the upper and lower sides of the stopping corner 115, such that the stopping corner 115 has enough wear strokes both on the top and bottom to offset the deformational stress generated by the body 1 in different directions, thereby further avoiding tearing of the solder 5.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   a body, having a plurality of accommodating slots penetrating the body, wherein a slot wall of at least one of the accommodating slots protrudes inward to form a boss, and the boss has a stopping corner; and
   a plurality of conductive terminals, correspondingly accommodated in the accommodating slots, wherein at least one of the conductive terminals has:
      an inclined portion, formed by tapering one side of the conductive terminal, wherein the inclined portion is adjacent to the stopping corner, the inclined portion is not parallel to a top surface of the boss, and the inclined portion is at least partially located above the stopping corner and configured to limit the conductive terminal from moving downward,
   wherein the electrical connector is configured to connect a chip module to a circuit board, a top surface of the body protrudes upward to form a plurality of supporting blocks configured to support the chip module, each of the supporting blocks has a notch, and a horizontal projection of the notch is located within a horizontal projection of a corresponding one of the accommodating slots.

2. The electrical connector of claim 1, wherein an acute included angle between the inclined portion and the slot wall of a corresponding one of the accommodating slots is less than 45 degrees.

3. The electrical connector of claim 1, wherein a height of the stopping corner is between an upper end and a lower end of the inclined portion.

4. The electrical connector of claim 1, wherein:
   each of the conductive terminals has a main portion bending laterally, and the main portion comprises a first base and a second base;
   the first base bends and extends upward to form an elastic arm, the elastic arm has a through slot, and an extending tail end of the elastic arm has a contact portion being arc-shaped and configured to be in contact with the chip module;
   the first base extends downward to form a soldering portion configured to be connected to the circuit board; and
   the second base extends upward to form a strip connecting portion.

5. The electrical connector of claim 4, wherein the soldering portion comprises two clamping arms configured to clamp a solder, and the two clamping arms extends beyond a horizontal projection of a corresponding one of the accommodating slots after the two clamping arms clamp the solder.

6. The electrical connector of claim 1, wherein the stopping corner is closer to a bottom surface of the body relatively than to a top surface of the body.

7. The electrical connector of claim 1, wherein the inclined portion is completely accommodated in a corresponding one of the accommodating slots.

8. The electrical connector of claim 1, wherein the slot wall of each of the accommodating slots includes a first surface, the boss protrudes out relative to the first surface, and the boss has a second surface deviated toward the accommodating slot relative to the first surface and a connecting surface connecting the first surface with the second surface, and a connecting location of the connecting surface and the second surface forms the stopping corner.

9. The electrical connector of claim 1, wherein an acute included angle between the connecting surface and the first surface is greater than an acute included angle between the inclined portion and the first surface.

10. The electrical connector of claim 1, wherein the first surface and the second surface are parallel to each other.

11. The electrical connector of claim 1, wherein the connecting surface is formed by extending downward obliquely from the first surface, an upper end of the inclined portion is higher than an upper end of the connecting surface, and a length of the inclined portion is greater than a length of the connecting surface.

12. The electrical connector of claim 1, wherein each of the conductive terminals has a protrusion, and the protrusion is located above the inclined portion and interferes with the first surface.

13. The electrical connector of claim 1, wherein the soldering portion comprises two clamping arms configured to clamp a solder, and the two clamping arms extends beyond a horizontal projection of a corresponding one of the accommodating slots after the two clamping arms clamp the solder.

14. The electrical connector of claim 1, wherein each of the conductive terminals has a main portion, the main portion bending and extending upward to form an elastic arm, the elastic arm is configured to be in contact with the chip module, and the inclined portion is located lower than a connecting location connecting the main portion to the elastic arm.

\* \* \* \* \*